(12) United States Patent
Pekny

(10) Patent No.: US 6,507,523 B2
(45) Date of Patent: Jan. 14, 2003

(54) NON-VOLATILE MEMORY WITH POWER STANDBY

(75) Inventor: Ted Pekny, Campbell, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/742,744

(22) Filed: Dec. 20, 2000

(65) Prior Publication Data

US 2002/0075724 A1 Jun. 20, 2002

(51) Int. Cl.[7] .................................................. G11C 7/00
(52) U.S. Cl. .................... 365/189.09; 365/226; 365/229
(58) Field of Search ................................. 365/226, 229, 365/189.09, 189.07, 196, 207

(56) References Cited

U.S. PATENT DOCUMENTS

| | | |
|---|---|---|
| 5,130,580 A | 7/1992 | Min et al. |
| 5,587,951 A * | 12/1996 | Jazayeri et al. ............. 365/203 |
| 5,610,533 A | 3/1997 | Arimoto et al. |
| 5,703,522 A | 12/1997 | Arimoto et al. |
| 5,854,561 A | 12/1998 | Arimoto et al. |
| 5,900,665 A | 5/1999 | Tobita |
| 6,052,307 A * | 4/2000 | Huber et al. .................. 327/52 |
| 6,072,723 A | 6/2000 | Guliani et al. |
| 6,075,738 A * | 6/2000 | Takano ........................ 365/210 |
| 6,122,212 A * | 9/2000 | Bui et al. ..................... 365/207 |
| 6,232,793 B1 | 5/2001 | Arimoto et al. |
| 6,292,398 B1 * | 9/2001 | Pasotti et al. ............ 365/285.21 |

* cited by examiner

Primary Examiner—David Nelms
Assistant Examiner—Thong Le
(74) Attorney, Agent, or Firm—Leffert Jay & Polglaze P.A.

(57) ABSTRACT

A zero power standby bias system controls the standby voltage levels of a current reference system used as a sense amplifier read reference in a non-volatile memory. The memory includes a non-volatile memory array having a plurality of memory cells coupled to bit lines. A plurality of sense amplifiers are coupled to the bit lines to determine the values stored in the memory cells in comparison to the reference signal provided by the reference system. The comparator circuit is not limited to a reference current, but can use reference voltages and a bit line voltage. The zero power standby bias system maintains a voltage level of the reference system to levels near those of operation while in standby mode, eliminating the need for the circuit to overcome large voltage differences and capacitance transitioning from low power or standby mode to active. The zero power standby bias system, therefore, eliminates overhead and speeds initial access times for non-volatile memory cells.

59 Claims, 6 Drawing Sheets

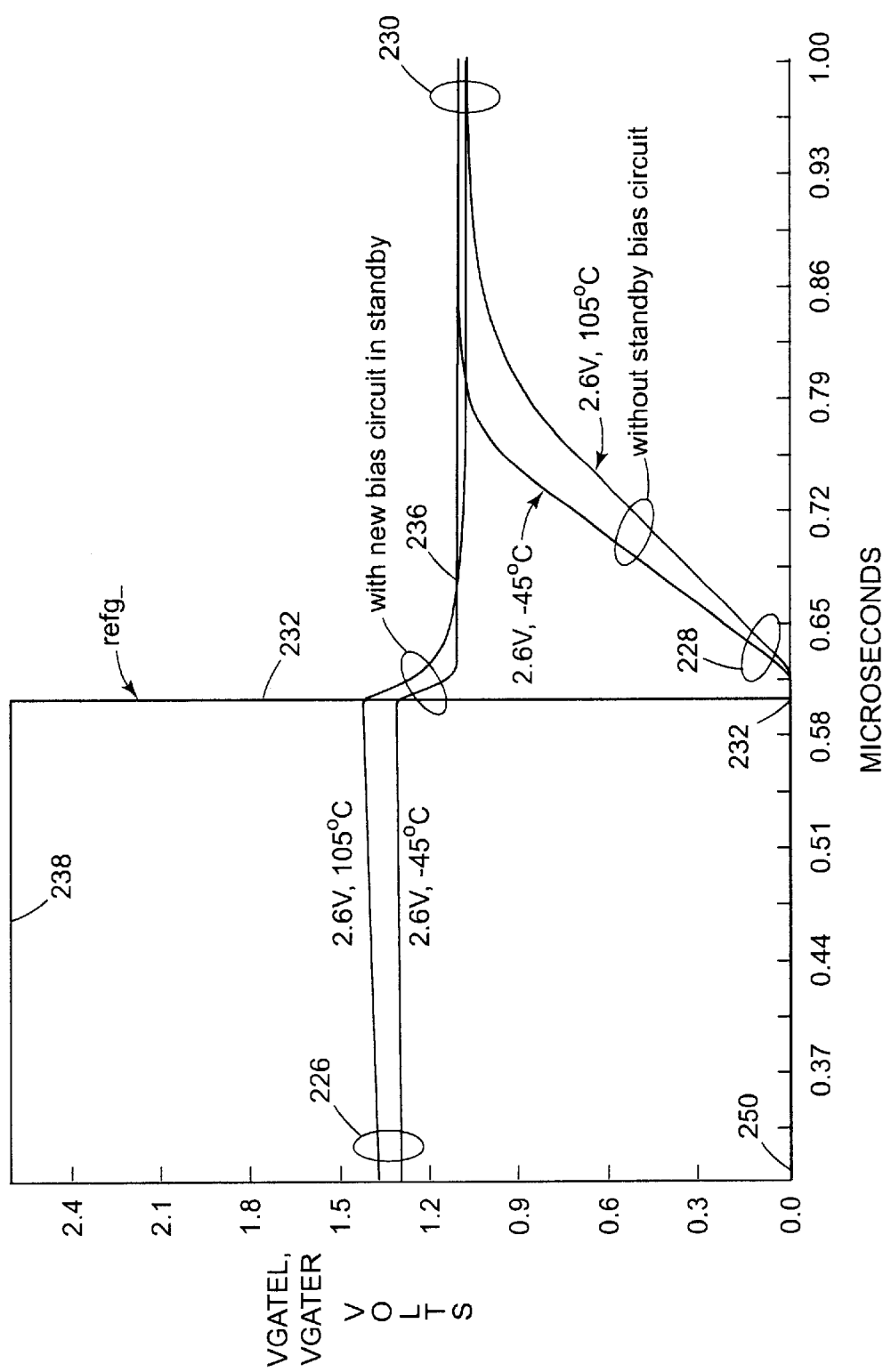
Fig. 7 Comparison of current mirror outputs, with and without standby bias.

NON-VOLATILE MEMORY WITH POWER STANDBY

TECHNICAL FIELD OF THE INVENTION

The present invention relates generally to memory devices and in particular the present invention relates to non-volatile memory devices with low or zero power standby modes.

BACKGROUND OF THE INVENTION

The use of non-volatile memory systems that maintain data integrity when a power supply is removed are expanding rapidly in integrated circuit technology. A class of non-volatile memory systems having memory cells which have a source, a drain, a channel, a floating gate over the channel and a control gate are widely used. Two popular types of non-volatile memory designs in this class are electronically erasable and programmable read only memories (EEPROM) and FLASH erasable-programmable read only memory (EPROM). The FLASH EPROM or flash memory system allows the simultaneous erasure of multiple memory cells.

The floating gate of the memory cell stores data and are generally formed from polysilicon members completely surrounded by an insulator. A flash memory cell is programmed when a charge is stored on the floating gate. Moreover, a memory cell is un-programmed, or erased, when the charge is removed from the floating gate. One method of programming a memory cell is accomplished by applying a positive potential (e.g., 4–7 V) to its drain and a programming potential (e.g., 10–15) to its control gate programs. This causes electrons to be transferred from the source to the floating gate of the memory cell. One method of erasing a memory cell is accomplished by applying a positive potential (e.g., 10–15 V) to its source while grounding the control gate and letting the drain float. This action removes electrons from the floating gate. The programming action of transferring electrons to the floating gate results in a memory cell that conducts less current when read than it would otherwise in the un-programmed state.

In non-volatile complementary metal-oxide semiconductor (CMOS) memories employing floating-gate memory devices, a memory array consisting of a number of these devices is customarily coupled to a common sensing circuit through a column line connecting the drains of the individual memory devices. Word lines are connected to the control gates of the devices in the array, to select the data word to be coupled on the column lines.

During a read operation in non-volatile complementary metal-oxide semiconductor (CMOS) memories employing floating-gate memory devices, an individual word line is selected and asserts a signal on the control gates of the memory cells. The memory cell will conduct current from its source to its drain. The drain is coupled to a column, or bit line. If a cell is programmed, the current is small compared to current conducted by an erased cell. The state of each individual floating gate memory device is then read from the level of current conducted through the column line by a sense amplifier. The individual sense amplifiers/comparators determine the state of the memory device by comparing the column current with a reference current conducted by a reference floating gate memory device that is set to conduct one-half of the current of an un-programmed floating gate memory device. This reference current is generated locally for the sense amplifier by a current mirror circuit that mirrors the current conducted through the reference floating gate memory cell.

When the memory device is in a low power or standby mode, the current mirror reference circuit is turned off and the circuit is put into low power mode. Upon leaving standby mode, the current mirror circuit must bring its output back to operating levels. In so doing, the current mirror output must overcome significant capacitive and parasitic effects. This process has the effect of significantly delaying the time that first access to the non-volatile memory employing floating-gate memory devices can be made after leaving a low power or standby mode.

For the reasons stated above, and for other reasons stated below which will become apparent to those skilled in the art upon reading and understanding the present specification, there is a need in the art for a system to minimize first access set up time from standby.

SUMMARY OF THE INVENTION

The above-mentioned problems with memories and other problems are addressed by the present invention and will be understood by reading and studying the following specification.

In one embodiment, a memory circuit comprises an array of memory cells arranged in columns using bit lines, a reference current generation circuit provides a reference current, a comparator circuit is coupled to the bit lines to sense bit line current and compare the bit line current to the reference current, and a bias circuit to maintain an operating bias on the reference current generation circuit when the memory is in low power mode.

In another embodiment, a memory device current reference circuit comprises a current reference source, a current mirror circuit, and a standby bias circuit that maintains an operating bias in the current mirror circuit when in a low power mode.

In a further embodiment, a memory system comprises an external processor, and a non-volatile memory coupled to the external processor. The non-volatile memory comprises: an array of memory cells arranged in columns coupled to bit lines, a comparator to compare a bit line current with a reference current and to produce an output signal, a reference current generation and distribution circuit to provide the reference current, and a standby bias circuit to maintain a bias in the reference current generation and distribution circuit when in a low power mode.

In another embodiment, a memory device current reference circuit comprises a reference generation source, a current replication and distribution circuit, and a bias maintenance circuit to maintain an operating bias in the current replication and distribution circuit when the memory device is not in an active mode.

A method of generating and distributing a reference current in a memory device comprising generating a reference current, replicating the reference current in a replication circuit, and maintaining a bias in the replication circuit when in a low power mode.

In yet another embodiment, a memory device sense amplifier comprises a current reference input to receive a reference current, a data input to receive a data input current, a comparator circuit to determine a relative level of the data current with the current reference, and a standby bias circuit to maintain a bias on the comparator circuit when in standby mode.

Another method of sensing a current data signal in a memory device comprising receiving a reference current on a reference current input, receiving a bit line current on a data input, comparing the reference current and the bit line current to determine a relative level, and maintaining a bias on the reference current input when in standby mode.

In yet another embodiment, a memory device current reference circuit comprises a reference circuit with a flash cell to provide a reference current, a reference control circuit to receive the reference current and output a control voltage on a control circuit output, a sense circuit coupled to receive the control voltage and replicate the reference current, and a bias circuit coupled to the control circuit output to maintain a bias during low power operation.

In a further embodiment, a non-volatile memory device comprises a current sense amplifier to compare a bit line current with a reference current, where the current sense amplifier generates the reference current in response to a voltage provided on a voltage connection, and a bias circuit coupled to the voltage connection to provide a bias voltage when the non-volatile memory is in a low power mode.

In yet another embodiment, a non-volatile flash memory comprises an array of non-volatile memory cells, a sense amplifier coupled to compare a bit line current with a reference current conducted through a reference transistor, a reference circuit coupled to a gate of the reference transistor to provide a reference voltage, and a bias circuit coupled to the gate of the reference transistor to provide a bias voltage.

In yet another embodiment, a non-volatile flash memory device comprises a flash memory cell programmed to conduct a reference current, a current mirror control NMOS transistor where a gate is coupled to a source, a drain is coupled to a positive power source, and the source is coupled to the flash memory cell, a current replication transistor where a gate is coupled to the source of the current mirror control NMOS transistor to replicate the reference current, a sense amplifier coupled to a bit line and coupled to the current replication transistor, and a bias circuit coupled to the gate of the current replication transistor to provide a bias voltage.

In another embodiment, a non-volatile flash memory device comprises a flash memory cell programmed to conduct a reference current, a current mirror control transistor coupled to the flash memory cell to sense the reference current and produce a current mirror control output, a current replication transistor where a gate is coupled to receive the current mirror control output and replicate the reference current, a sense amplifier coupled to receive a bit line current and the reference current from the current replication transistor, and a bias circuit coupled to the gate of the current replication transistor to provide a bias voltage.

BRIEF DESCRIPTION OF THE DRAWINGS

FIG. 7 is a graphed comparison of current mirror outputs as they transition from standby to active mode with and without the zero power bias circuit.

DETAILED DESCRIPTION OF THE INVENTION

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Figure 1:
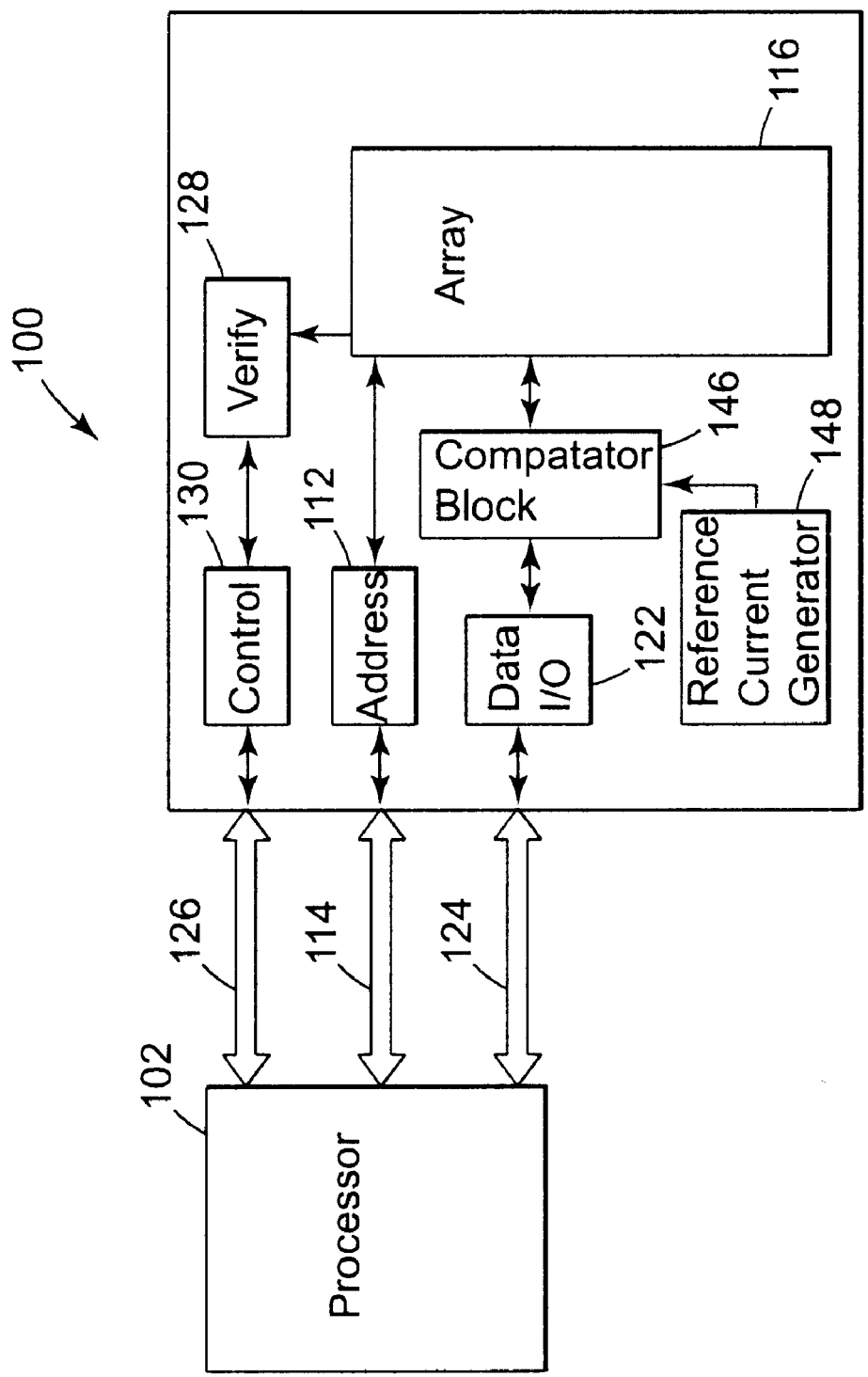
FIG. 1 is a simplified block diagram of a non-volatile memory of one embodiment of the present invention that is coupled to an exterior processor.

FIG. 1 illustrates a block diagram of a flash memory device 100 that is coupled to an external processor 102. The memory device 100 has been simplified to focus on features of the memory that are helpful in understanding the present invention. The memory device 100 includes an array 116 of memory cells 110. The memory cells 110 are illustrated in detail in FIG. 2. The memory cells 110 are preferably floating gate memory cells, and the array 116 is arranged blocks of rows and columns. The blocks allow the memory cells 110 to be erased in large groups. Data, however, is stored in the memory array 116 in small data groups (byte or group of bytes) and separate from the block structure. Erase operations are usually performed on a large number of cells in parallel.

Address decode circuitry 112 is provided to decode address signals provided on address lines A0–Ax 114. Address signals are received and decoded to access the memory array 116. Data input and output buffer circuits 122 are included for bi-directional data communication over a plurality of data (DQ) lines 124 with the external processor 102. Control circuit 130 decodes signals provided on control lines 126 from the external processor 102. These signals are used to control the operations of the memory, including data read, date write, and erase operations. During a read operation data signals from memory cells 110 are selected from the memory array. The signals from the selected memory cells 110 are interpreted by the comparator block 146, utilizing the reference current generator 148 before being buffered by the data input and output buffer circuits 122. Verify circuits 128 are included for verifying the state of a memory cell 110.

In addition, state machine(s) can be provided as part of the control circuitry to perform read, write and erase operations.

As stated above, the flash memory of FIG. 1 has been simplified to facilitate a basic understanding of the features of the memory. Further, it will be appreciated that more than one flash memory can be included in various package configurations. For example, flash memory cards can be manufactured in varying densities using flash memories.

Figure 2:
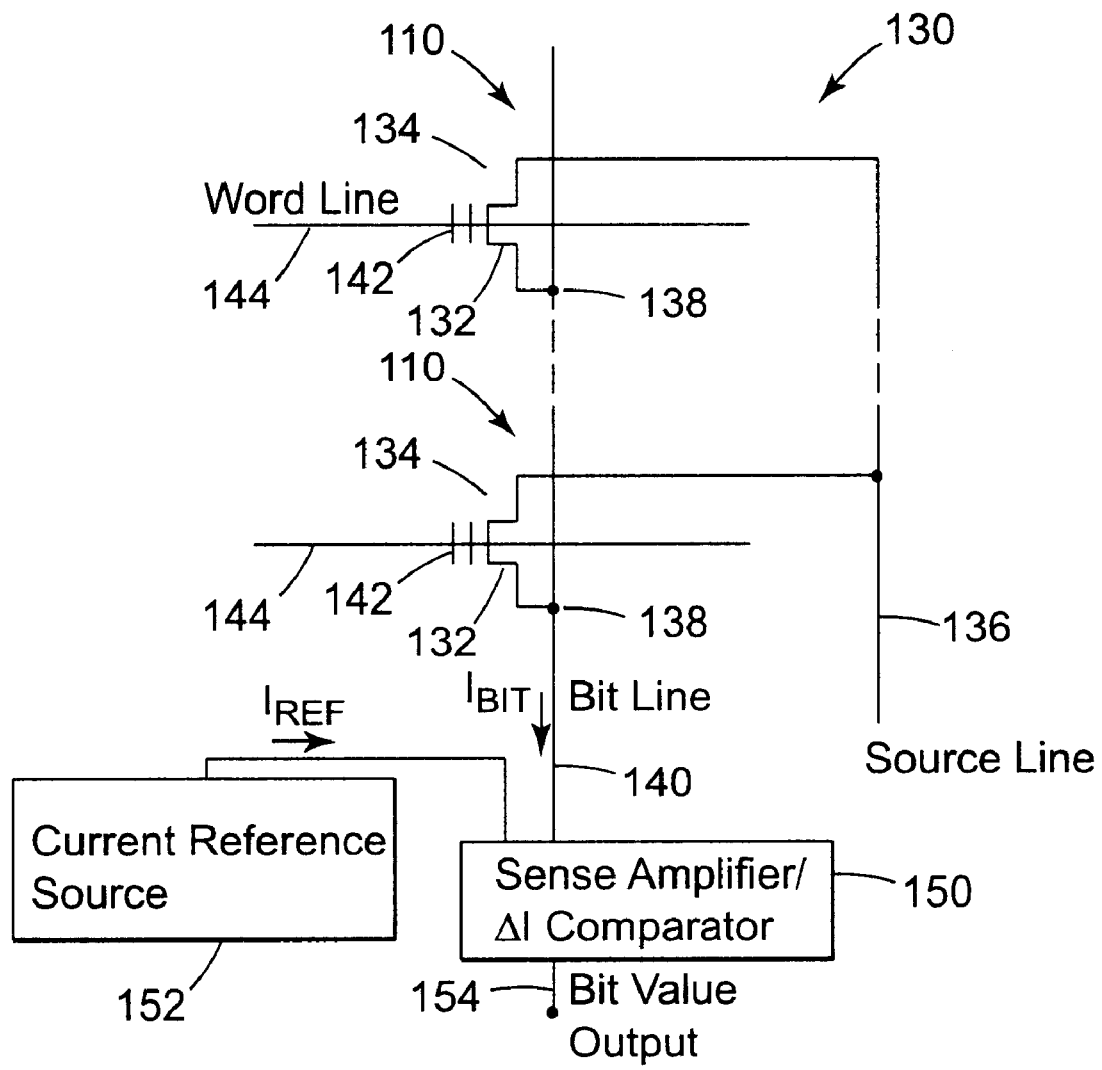
FIG. 2 is a simplified diagram of a flash memory device of an embodiment of the present invention showing sense amplifiers, reference current source, word, and column lines.

A more detailed illustration of a flash memory array 130 is provided in FIG. 2. As FIG. 2 illustrates, the memory cells 110 are made up of floating gate transistors 132 that are arranged in a plurality of rows and columns (only one column is illustrated). In the memory array, the source regions 134 of each memory cell in a row are connected to a common source line 136. The drain regions 138 of each memory cell in a column are connected to a common bit line 140. In addition, control gates 142 of each memory cell 110 in a row are connected to a word line 144. The common bit line is connected to a sense amplifier/comparator 150 that detects the bit value stored in the memory cell 110. This bit value detection is accomplished by comparing the current ($I_{BIT}$) placed on the bit line 140 by the selected memory cell 110 to the current generated by a reference current source 152, ($I_{REF}$). The array of FIG. 2 has been simplified to illustrate the basic arrangement of memory cells and bit lines. Those skilled in the art will appreciate that the schematic diagram has been simplified to focus on the present invention and that additional rows and columns would be implemented to create a complete memory device.

Figure 3:
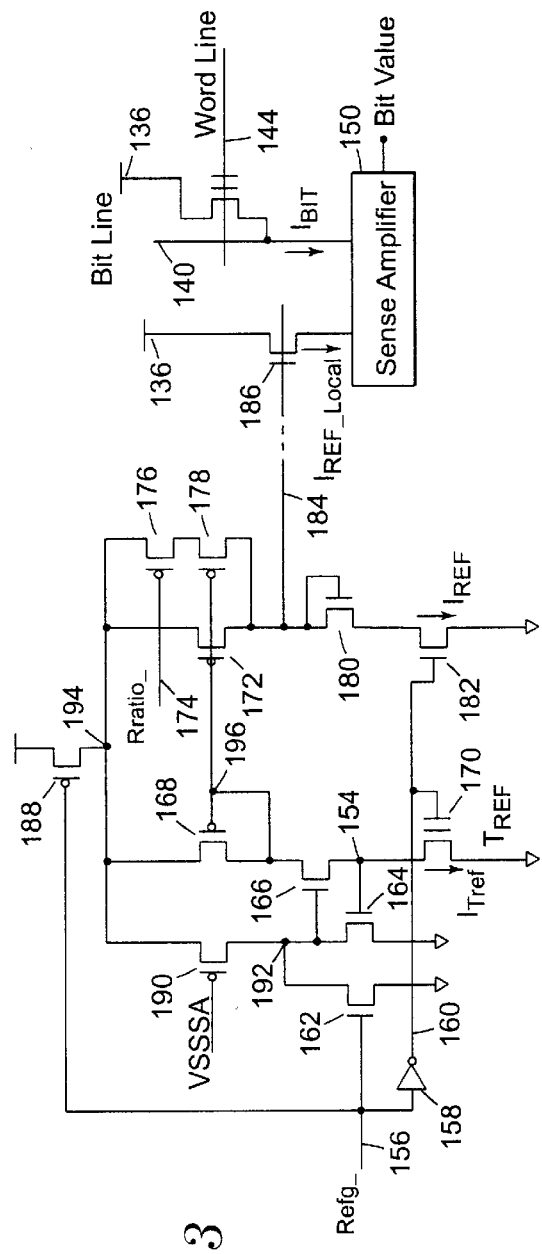
FIG. 3 is an example of a current mirror circuit.

A detailed view of an example reference current generating and mirror circuit for non-volatile memory is shown in FIG. 3. This circuit generates a reference current ($I_{REF}$) from a floating gate transistor programmed to conduct one half the current of an un-programmed cell. This current is replicated by the current mirror circuit and used to provide a gate control signal on a signal line network 184. The reference current ($I_{REF}$) is then locally reproduced from the gate control signal by transistor 186 for each individual comparator 150 and corresponding common bit line 140. That is, a reference current through transistor 170 is mirrored through transistor 168 to transistor 172. A reference voltage is therefore provided on node 184. The reference voltage is used by transistor 186 to replicate the reference current in sense amplifier circuitry.

The current mirror of FIG. 3 is controlled by the active low signal, Refg__ 156. When Refg__ is inactive (high), current conducted through the transistor 188 is turned off, disabling power to circuit node 194. Refg__ inactive (high) also enables transistor 162, connecting circuit node 192 to ground. Node 192 at ground potential eliminates the gate drive for transistor 166 which prevents current flow through it and reference transistor ($T_{REF}$) 170. Additionally, through inverter 158, Refg__ inactive (high) disables the gate drives and thus turns off both the reference transistor ($T_{REF}$) 170, and transistor 182. With transistor 182 inactive, the output of the current mirror (transistors 168 and 172) onto the gate control signal line network 184 and to the local current mirror transistors 186 is disabled. With gate drive to transistor 186 disabled the local current reference, $I_{REF\_Local}$, for the sense amplifier/comparator 150 is turned off.

When the circuit is enabled and signal Refg__ is active (low) the drive for the gate of transistor 188 is on, restoring power through transistor 188 to circuit node 194 and to the rest of the current mirror circuit. Additionally, through inverter 158, Refg__ active (low) enables the gate drives for programmed reference transistor ($T_{REF}$) 170 and transistor 182. Refg__ active (low) also disables transistor 162, allowing node 192 to rise, thereby restoring the gate drive for transistor 166 and enabling current to flow through the programmed reference transistor ($T_{REF}$) 170. As the reference transistor ($T_{REF}$) 170 regulates the current flow from transistor 166 to the programmed reference level the voltage signal on node 154 rises. The voltage level on node 154 drives the gate of NMOS transistor 164 activating it. The active transistor 164 regulates the voltage signal on node 192 and therefore in turn transistor 166 and the voltage level on node 154 in a feedback control loop. This feedback loop guarantees that node 154, which feeds the reference transistor ($T_{REF}$) 170, is at least one threshold voltage ($V_T$) above the ground plane when in operating mode.

As power is supplied from node 194 though the drain-gate connected PMOS transistor 168 and NMOS control transistor 166, the reference current ($I_{Tref}$) is set by the maximum current flow through the enabled programmed reference transistor ($T_{REF}$) 170. The gate voltage level on node 196 of the drain-gate connected PMOS transistor 168 rises to put it in active mode. In this drain-gate connected configuration the PMOS transistor 168 will set its gate voltage to just allow the transistor to supply the current being set by the enabled programmed reference transistor ($T_{REF}$) 170. The voltage signal being set by transistor 168 on node 196 is utilized to drive the gate of PMOS transistor 172, so that it mirrors the current flowing in transistor 168, set by reference transistor ($T_{REF}$) 170.

Refg__ active (low) also drives the gate of transistor 182, turning it on to flow the mirrored current from transistor 172, through the drain-gate connected NMOS transistor 180. The gate voltage, on signal line 184, of drain-gate connected NMOS transistor 180, rises to put transistor 180 in active mode and allow it to supply the current being set by the mirroring PMOS transistor 172. This gate voltage is utilized as the output of the current mirror onto the gate control signal line network 184, and is the gate voltage level that transistor 180 requires to flow the reference current ($I_{REF}=I_{Tref}$).

This voltage is sent across gate control signal line network 184 to the control gates of local current mirror NMOS transistors 186, driving them at the same level required to flow a current equal to $I_{REF}$. Thus starting generation of the local current reference, $I_{REF\_Local}$, for the sense amplifier/comparator 150.

An additional feature of the current mirror circuit of FIG. 3 allows for the initial reference current set by the reference transistor ($T_{REF}$) 170 to be adjusted by multiples. Allowing for different current references ($I_{REF}$) to be generated by the same circuit. An example of this technique is shown in the current mirror of FIG. 3 by the circuit comprised of PMOS transistors 176 and 178 and their connections. The gate of PMOS transistor 178 is driven by the same signal from node 196 as transistor 172 and will therefore flow the same current if enabled. When the circuit is enabled by active low signal Rratio__, current is allowed to flow through transistor 176 from source node 194. With the gate of transistor 176 being driven by the control signal from node 196, a current identical ($I_{Tref}$) to that set by programmed reference transistor 170 ($T_{REF}$) will be allowed to pass. The currents flowing from transistor 172 and transistor 178 combine at node 198 giving a total current of $I_{Tref}+I_{Tref}=2I_{Tref}$ flowing into the source-gate connected NMOS transistor 180, setting the generated $I_{REF}=2I_{Tref}$. Thus generating a voltage signal that will set, across the distribution network 184, a current $I_{REF\_Local}=I_{REF}=2I_{Tref}$ for the sense amplifier/comparator 150 in local NMOS transistor 186. Additional variations of this current adjustment technique can be inferred by the skilled practitioner from the above example.

Figure 4:
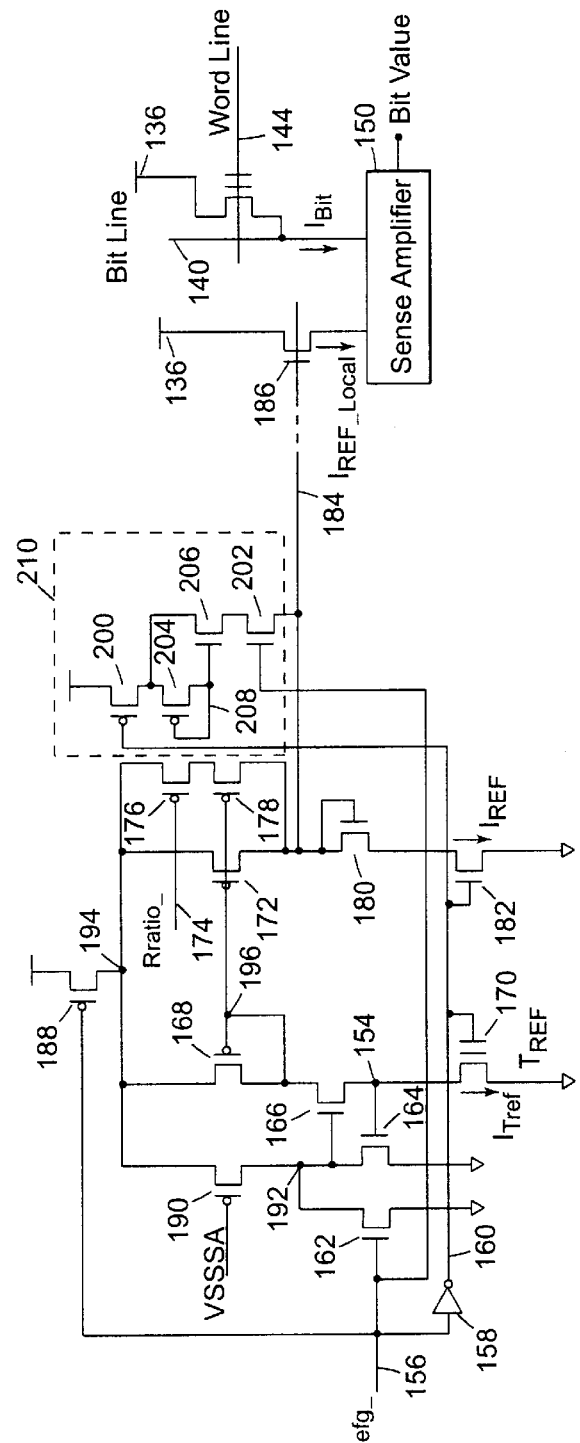
FIG. 4 is an example of a current mirror circuit with a zero power standby bias system.

Shown in FIG. 4 is another example reference current mirror, similar to that of FIG. 3, although incorporating a zero power standby bias circuit 210. The zero power standby bias circuit 210, comprising the transistors 200, 202, 204, 206, and associated connections, has the effect of maintaining a bias on node 184 of the reference current mirror when the non-volatile memory is in a low power or standby mode.

In this circuit, NMOS transistor 202 is driven by the active low control signal Refg__. This transistor serves to isolate the zero power standby bias circuit 210 from node 184 when the current mirror circuit is in active mode and driving gate control network 184. Refg__ when active (low), through inverter 158, additionally drives the gate of PMOS transistor 200. This inactivates PMOS transistor 200 and isolates the zero power standby bias circuit 210 from the positive power supply.

When the current mirror of FIG. 4 is inoperative, and signal Refg__ is inactive (high), the zero power bias circuit 210 is active. Typically this happens when the non-volatile memory is in low power or stand by mode. In this state, the inactive (high) control signal Refg__ 156 drives the gate of NMOS transistor 202, connecting the zero power bias circuit 210 to gate control network 184. Additionally, through inverter 158, Refg__ 156 drives PMOS transistor 200, connecting the zero power bias circuit 210 to power. Current will then flow through transistor 200 and to the drain-gate connected PMOS transistor 204, activating it. With PMOS transistor 204 activated, the voltage level on circuit node 208 increases until it reaches a signal level of one threshold voltage ($V_T$) below that of the positive supply source and PMOS transistor 204 starts to enter cut off mode. The drain input of NMOS transistor 206 is connected to power through transistor 200. Its gate is connected to circuit node 208 and is therefore driven when the circuit is active at a level one $V_T$ below its drain. Gate control network 184 is connected to the source of NMOS transistor 202 and therefore kept powered when the non-volatile memory is in standby mode instead of being allowed to drop. The voltage on gate control network 184 will rise to a level within one $V_T$ of the gate input of NMOS transistor 206 before transistor 206 stops conducting. The gate input of NMOS transistor 206 is, as noted above, coupled to circuit node 208 and therefore itself one threshold voltage level ($V_T$) below the positive power supply because of drain-gate connected PMOS transistor 204. Consequently the limit that the bias voltage on gate control network 184 can rise to is two threshold voltage levels below the positive supply ($V_T+V_T=2V_T$).

Upon the non-volatile memory exiting standby mode the zero power standby bias circuit deactivates and the current mirror activates as described above. Because of the action of the zero power standby bias circuit while the non-volatile memory was in standby mode the current mirror circuit has only minor adjustments in voltage levels to make to bring the output of the current mirror to operating levels.

Figure 5:
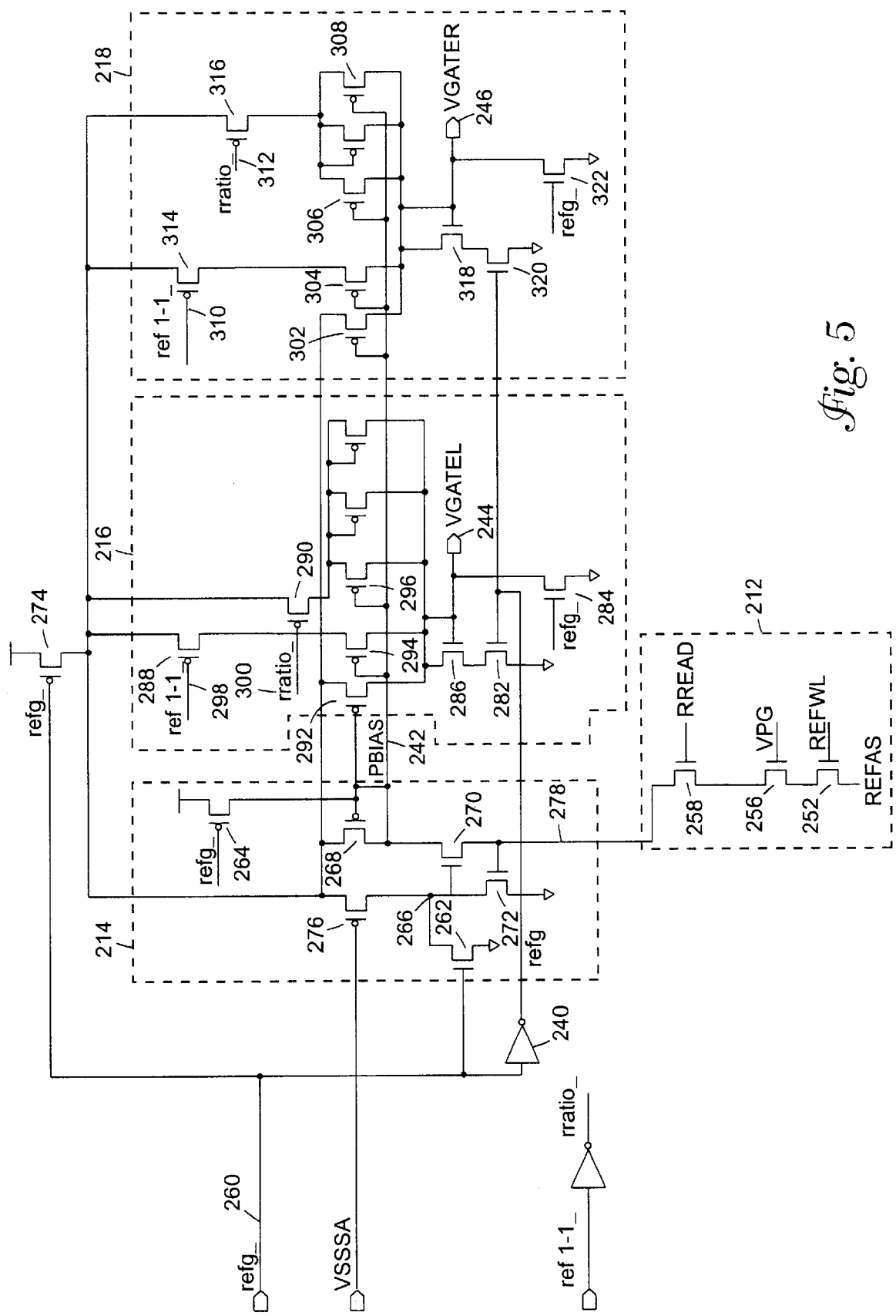
FIG. 5 shows another example of a current mirror.

Shown in FIG. 5 is a schematic of an alternative embodiment of a reference current mirror. The circuit of FIG. 5 is enabled by the active low signal, refg__ 260. Circuit block 212 contains a reference transistor 252 in a half programmed state and current flow control transistors 256 and 258. Circuit block 214 generates a master control signal, PBIAS, on circuit node 242, in response to current conducted by the reference transistor 252 of block 212. When refg__ is active (low) it turns on PMOS transistor 274 enabling current to flow to the circuits of FIG. 5. In block 214 refg__, through inverter 280, turns off PMOS transistor 264, stopping its clamping of node 242 to the positive power supply. Simultaneously, refg__ 260 active (low) turns off NMOS transistor 262, allowing the voltage level on node 266 to rise as current flows into it from PMOS transistor 276. As the voltage on node 266 rises, it enables NMOS transistor 270 and allows current to flow to reference transistor 252 of block 212. As the reference transistor 252 of block 212 regulates the current flow from transistor 270 to the programmed reference level the voltage signal on node 278 rises. The voltage level on node 278 drives the gate of NMOS transistor 272 activating it. The active transistor 272 regulates the voltage signal on node 266, and therefore in turn transistor 270 and the voltage level on node 278, in a feedback control loop. This feedback loop guarantees that node 278, which feeds circuit block 212 and reference transistor 252, is at least one threshold voltage ($V_T$) above the ground plane when in operating mode. The current flow controlled by reference transistor 252, through NMOS transistor 270, sets the current flow through drain-gate connected PMOS transistor 268. The voltage level on circuit node 242, PBIAS, will drop until the gate of the drain-gate connected PMOS transistor 268 is driven enough to allow the transistor to pass the current flow ($I_{REF}$) set by reference transistor 252.

The reference current mirror of FIG. 5 has dual outputs, VGATEL 244 and VGATER 246, intended to drive the separate left and right sides of an array of memory. These outputs, VGATEL 244 and VGATER 246, are generated by output stages with adjustable current ratio multipliers contained in the comparable circuit blocks 216 and 218. The output circuits of blocks 216 and 218 are enabled by the active low signal, refg__ 260. When refg__ is active (low), power is provided to the circuits of blocks 216 and 218 by the enabled PMOS transistor 274.

Focusing on the circuit block 216 for the moment, the active low signal refg__ disables the NMOS transistor 284, which pulls the output VGATEL 244 to ground when the output circuit of block 216 is not active. Additionally refg__, through inverter 280, drives NMOS transistor 282, which enables current to flow from the circuit of block 216. The PMOS transistor 292 is driven active by the voltage signal on its gate, PBIAS, off of circuit node 242. Since PMOS transistor 292 is being driven by the same voltage signal, PBIAS 242, as that of the PMOS transistor 268 of circuit block 214, it will flow the same current ($I_{REF}$) as that of transistor 268. The current from PMOS transistor 292, $I_{REF}$, flows through the drain-gate connected NMOS transistor 286 and the circuit-enabling transistor 282 to the negative power rail. The voltage on circuit node 244 connected to the gate of the drain-gate connected NMOS transistor 286 raises to drive the transistor 286 to the point where the current ($I_{REF}$) flows. The voltage thus set on node 244 drives the output of circuit block 214, VGATEL 244. The output VGATEL 244 is used (not shown) to drive the gate inputs of remote transistors and set them to mirror the current ($I_{REF}$) locally.

The circuit block 216 also allows the reference current to be adjusted by multiples by controlling the active low inputs ref1 to 1__ 298 and rratio__ 300. The input ref1 to 1__ 298 enables PMOS transistor 288 and allows current to flow to PMOS transistor 294. The gate of PMOS transistor 294 is driven by signal PBIAS 242 from circuit block 214 and thus will be driven to flow the reference current ($I_{REF}$) as will the mirror transistor 292. The current from PMOS transistor 294 will combine with that of the PMOS mirror transistor 292 to drive the drain-gate connected NMOS transistor 286 at a current of $I_{REF}+1_{REF}=2I_{REF}$. This effectively multiplies the current reference output control signal of VGATEL 244 to $2I_{REF}$. Input rratio__ 300 when active (low) operates in a similarly to ref1 to 1 298. Input rratio__ 300 activates PMOS transistor 290 and enables current flow to current mirroring PMOS transistor 296, which is driven off of PBIAS 242 and will therefore flow a current equal to $I_{REF}$ and adds to the current flowing to drain-gate connected NMOS transistor 286. As can be seen, this allows currents and outputs on VGATEL 244 to be selected from $I_{REF}$, $2I_{REF}$, and $3I_{REF}$, as desired.

It should be noted that the output block 218 is identical to the output block 216, excepting that the input rratio__ 312 controls two mirroring PMOS transistors 306, and 308, instead of one. Thus rratio__ 312 in output block 216 adds a current flow of $2I_{REF}$ to the final output when active. This allows a currents and outputs on VGATER 246 of $I_{REF}$, $2I_{REF}$, $3I_{REF}$, and $4I_{REF}$, to be selected.

Figure 6:
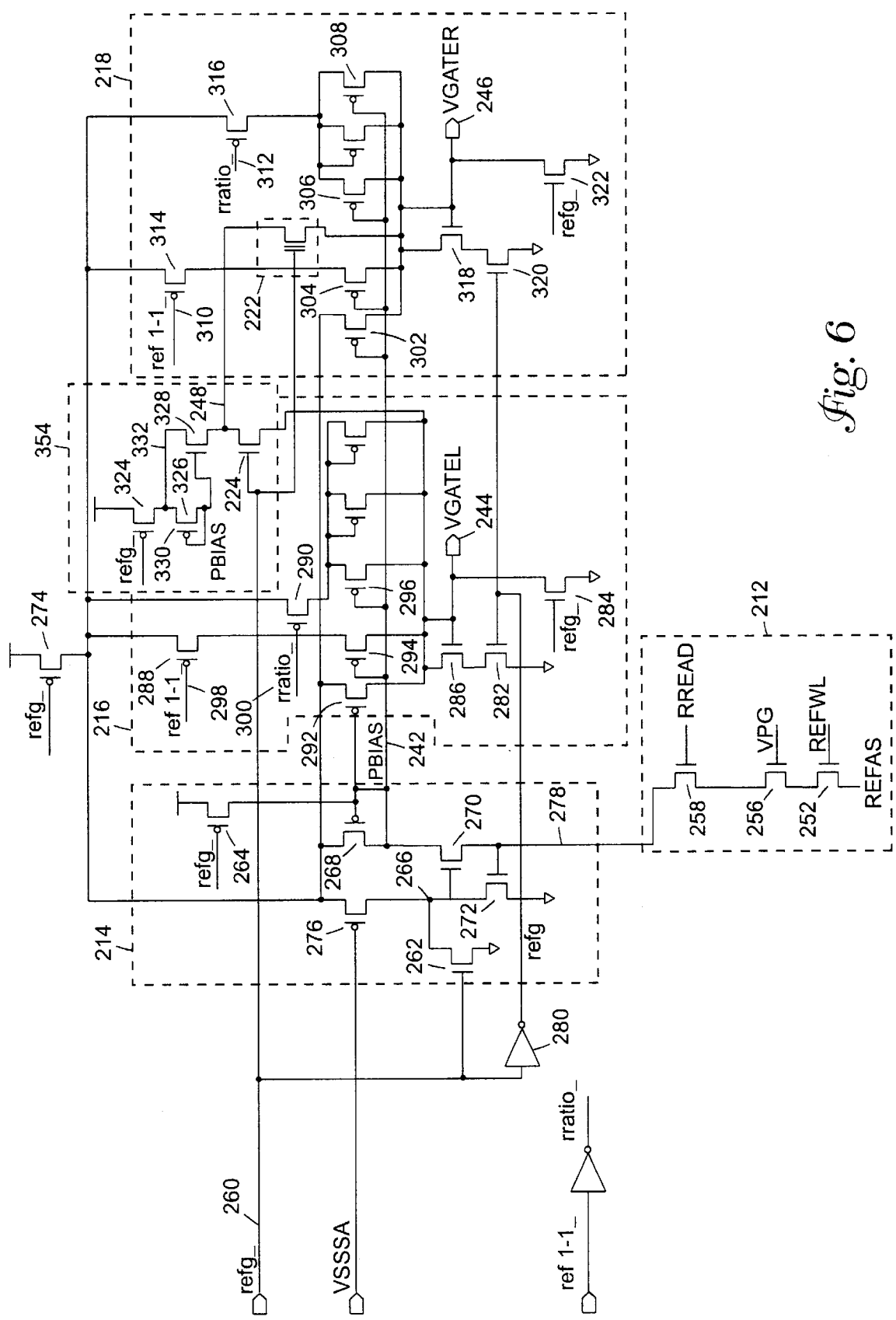
FIG. 6 shows the current mirror of FIG. 5 with a zero power bias circuit.

Shown in FIG. 6 is the schematic of the reference current mirror of FIG. 5 but additionally incorporating a zero power bias circuit represented by block 254. The circuit of FIG. 6 furthermore is lacking the output pull down transistors 284 and 322 of the circuit of FIG. 5, as the outputs will have a bias while in a low power mode.

When the current mirror circuit is in standby mode, the zero power bias circuit in block 254 is enabled by the active low signal refg_ 260 activating the NMOS transistors 224 and 222. Transistor 224 couples the zero power bias circuit 254 to output VGATEL 244 of circuit block 216, transistor 222 couples the zero power bias circuit 254 to output VGATER 246 of circuit block 218. The active low signal refg_ 260, through inverter 280, activates PMOS transistor 324 and connects the zero power bias circuit 254 to the positive power source. Current flows through transistor 324 to the drain-gate connected PMOS transistor 326, activating it and allowing the voltage signal on circuit node 330 to rise. The voltage signal on circuit node 330 increases until it is one threshold voltage ($V_T$) below that of the voltage on circuit node 332 and PMOS transistor 326 starts to enter cutoff. The voltage on node 330 is connected to the gate of NMOS transistor 328, and activates it as it rises. The active transistor 328 allows current to flow through transistor 224 to the output node VGATEL 244 biasing it. Similarly, current flows from node 248 through transistor 222 to the output node VGATER 246. Preferably, the output nodes VGATEL 244, and VGATER 246 are electrically isolated, and allowed to float, but it is not required for operation. As the bias levels on the nodes VGATEL 244 and VGATER 246 increase the voltage level on node 248 increases as well. The NMOS transistor 328 will stop flowing current to node 248 as the voltage level on node 248 reaches within one threshold voltage level ($V_T$) of the transistor's gate voltage, and the transistor starts to enter cutoff. As circuit node 330 has already been set at one threshold voltage ($V_T$) below the level of the positive supply by transistor 326, the bias voltage on node 248, and through it the outputs VGATEL 244 and VGATER 246, will be maintained at a maximum level of two threshold voltage levels ($2V_T$) below the positive power supply while the circuit is in a low power mode.

Shown in FIG. 7 is a graph comparing current mirror outputs from the circuits of FIG. 5, without the zero power standby bias circuit, and FIG. 6, with the zero power standby bias circuit. In this graph, signal voltage is shown on the Y-axis and time in microseconds on the X-axis. The active low signal refg_ is shown transitioning from high (2.5 volts) 238 to low (zero volts) 250 at a time of 0.60 microseconds 232, enabling the reference current mirrors of FIGS. 5 and 6 and activating their outputs. The output of the reference current mirror (VGATEL 244 or VGATER 246) of FIG. 5, without the zero power bias circuit, is shown transitioning from zero volts at 0.60 microseconds 232 to an active stable output at point 230. The output of the reference current mirror (VGATEL 244 or VGATER 246) of FIG. 6, with the zero power bias circuit 220, is shown transitioning from about 1.3 volts at 0.60 microseconds 232 to an active stable output at point 236. As evidenced by these curves, the time between activation and stable output for the reference current mirror with the zero power bias circuit is significantly less than that of the reference current mirror without the zero power bias circuit.

CONCLUSION

A zero power standby bias system has been described that controls the standby voltage level of a reference current mirror in a non-volatile memory. The memory includes a non-volatile memory array having a plurality of memory cells coupled to bit lines. A plurality of sense amplifiers are coupled to the bit lines, sensing the bit state of the selected memory cells output in comparison to a reference current provided by the reference current circuit. The zero power standby bias system maintains a mid-level output of the reference current circuit while the memory is in standby or a low power mode such that the voltage differential the reference current circuit must overcome upon entering active mode is minimal, greatly decreasing the time to initial access.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A memory circuit comprising:
   an array of non-volatile memory cells arranged in columns coupled to bit lines;
   a reference current generation circuit to provide a reference current;
   a comparator circuit coupled to the bit lines to sense bit line current and compare the bit line current to the reference current; and
   a bias circuit to maintain an operating bias on the reference current generation circuit when the memory is in low power mode.

2. A memory circuit comprising:
   an array of non-volatile memory cells arranged in columns coupled to bit lines;
   a reference current generation circuit to provide a reference current;
   a comparator circuit coupled to the bit lines to sense bit line current and compare the bit line current to the reference current, wherein the comparator circuit comprises a reference transistor coupled to mirror the reference current; and
   a bias circuit to maintain an operating bias on the reference current generation circuit when the memory is in low power mode, wherein the bias circuit is coupled to provide the operating bias to a gate of the reference transistor.

3. The memory circuit of claim 2, wherein the bias circuit comprises:
   a PMOS transistor having a source coupled to a positive voltage source and a gate coupled to its drain; and
   a NMOS transistor with a drain coupled to the positive voltage source and a gate coupled to the drain of the PMOS transistor, a source of the NMOS transistor is coupled to the gate of the reference transistor.

4. The memory circuit of claim 3, wherein the bias circuit further comprises a first transistor coupled between the source of the NMOS transistor and the gate of the reference transistor to isolate the bias circuit when the memory is not in the low power mode.

5. The memory circuit of claim 4, wherein the bias circuit further comprises a second transistor coupled between the positive voltage source and the bias circuit to isolate it from the positive voltage source when not in the low power mode.

6. The memory circuit of claim 3, wherein the bias circuit charges the gate of the reference transistor to an operating bias without a conducting path to a ground connection when the memory circuit is in the low power mode.

7. The memory circuit of claim 2, wherein the reference current generation circuit comprises:
   a reference current source; and
   a reference current replication circuit to provide an output, wherein the output of the reference current replication circuit can be selectively adjusted to provide a scalar representation of the reference current source.

8. A memory device current reference circuit comprising:
   a current reference source;
   a current mirror circuit; and
   a standby bias circuit that maintains an operating bias in the current mirror circuit when in a low power mode.

9. The memory device current reference circuit of claim 8, wherein the current reference circuit is incorporated into a non-volatile memory.

10. A memory device current reference circuit comprising:
    a current reference source;
    a current mirror circuit; and
    a standby bias circuit that maintains an operating bias in the current mirror circuit when in a low power mode, wherein the current mirror circuit comprises:
       a mirror control circuit to provide a voltage output generated from the current reference source; and
       a reference transistor coupled to the voltage output to mirror the reference current.

11. A memory device current reference circuit comprising:
    a current reference source;
    a current mirror circuit containing a mirror control circuit to provide a voltage output generated from the current reference source;
    a reference transistor coupled to the voltage output to mirror the reference current; and
    a standby bias circuit that maintains an operating bias in the current mirror circuit when in a low power mode, wherein the bias circuit is coupled to the reference transistor gate to provide an operating bias to the transistor.

12. The memory device current reference of claim 11, wherein the bias circuit comprises:
    a PMOS transistor having a source coupled to a positive power source and a gate is coupled to its drain; and
    a NMOS transistor having a drain coupled the positive power source and a gate coupled to the drain of the PMOS transistor and a source of the NMOS transistor is coupled to the gate of the reference transistor.

13. The memory device current reference of claim 12, wherein the bias circuit further comprises a first transistor coupled between the source of the NMOS transistor and the gate of the reference transistor to isolate the bias circuit when the memory device is not in the low power mode.

14. The memory device current reference of claim 12, wherein the bias circuit further comprises a second transistor coupled between the positive power source and the bias circuit to isolate the bias circuit from the positive power source when not in the low power mode.

15. The memory device current reference of claim 12, wherein the bias circuit charges the gate of the reference transistor to an operating bias without a conducting path to a ground connection when the memory circuit is in low power mode.

16. A memory device current reference circuit comprising:
    a current reference source;
    a current mirror circuit; and
    a standby bias circuit that maintains an operating bias in the current mirror circuit when in a low power mode, wherein the current mirror circuit can be selectively adjusted to conduct a current that is a multiple of a current conducted by the current reference source.

17. A memory system comprising:
    an external processor; and
    a non-volatile memory coupled to the external processor, the non-volatile memory comprises,
       an array of memory cells arranged in columns coupled to bit lines,
       a comparator to compare a bit line current with a reference current and produce an output signal,
       a reference current generation and distribution circuit to provide the reference current, and
       a standby bias circuit to maintain a bias in the reference current generation and distribution circuit when in a low power mode.

18. A memory system comprising:
    an external processor; and
    a non-volatile memory coupled to the external processor, the non-volatile memory comprises,
       an array of memory cells arranged in columns coupled to bit lines,
       a comparator to compare a bit line current with a reference current and produce an output signal, wherein the comparator circuit comprises,
          a reference transistor coupled to the reference current generation and distribution circuit,
          a reference current generation and distribution circuit to provide the reference current, and
          a standby bias circuit to maintain a bias in the reference current generation and distribution circuit when in a low power mode, wherein the standby bias circuit is coupled to provide the operating bias to a gate of the reference transistor.

19. The memory system of claim 18, wherein the standby bias circuit further comprises:
    a PMOS transistor where a source is coupled to a positive power source and a gate is coupled to a drain; and
    a NMOS transistor where a drain is coupled to the positive power source, a gate is coupled to the drain of the PMOS transistor, and a source of the NMOS transistor is coupled to the gate of the reference transistor.

20. The memory system of claim 19, wherein the standby bias circuit further comprises a first transistor coupled between the source of the NMOS transistor and the gate of the reference transistor to isolate the standby bias circuit when the non-volatile memory is not in the low power mode.

21. The memory system of claim 20, wherein the standby bias circuit further comprises a second transistor coupled between the positive power source and the bias circuit to isolate it from the positive power source when not in the low power mode.

22. The memory system of claim 19, wherein the bias circuit charges the gate of the reference transistor to an operating bias without a conducting path to a ground connection when the memory is in low power mode.

23. A memory system comprising:
    an external processor, and
    a non-volatile memory coupled to the external processor, the non-volatile memory comprises, an array of memory cells arranged in columns coupled to bit lines, a comparator to compare a bit line current with a reference current and produce an output signal, a reference current generation and distribution circuit to provide the reference current, wherein the reference current generation and distribution circuit can be selectively adjusted to conduct a current that is a multiple of a current conducted by a current reference source, and a standby bias circuit to maintain a bias in the reference current generation and distribution circuit when in a low power mode.

24. A memory device current reference circuit comprising:

a reference current generation source;

a current replication and distribution circuit; and a bias maintenance circuit to maintain an operating bias in the current replication and distribution circuit when the memory device is not in an active mode.

25. The memory device current reference circuit of claim 24, wherein the current reference circuit is integrated into a non-volatile memory.

26. The memory device current reference circuit of claim 24, wherein the current replication and distribution circuit generates an output voltage from the reference current generation source and the output voltage is coupled to gates of a plurality of current replication transistors.

27. The memory device current reference circuit of claim 26, wherein the bias maintenance circuit is coupled to the gates of the plurality of current replication transistors.

28. The memory device current reference circuit of claim 27, wherein the bias maintenance circuit comprises:

a PMOS transistor where a source is coupled to a power source and a gate is coupled to a drain; and a NMOS transistor where a drain is coupled to the power source, a gate is coupled to the drain of the PMOS transistor, and a source of the NMOS transistor is coupled to the gates of the plurality of current replication transistors.

29. The memory device current reference circuit of claim 28, wherein the bias maintenance circuit further comprises a first transistor coupled between the source of the NMOS transistor and the gates of the plurality of current replication transistors to isolate the bias maintenance circuit.

30. The memory device current reference circuit of claim 28, wherein the bias maintenance circuit further comprises a second transistor coupled between the positive power source and the bias maintenance circuit to isolate the bias maintenance circuit from the power source.

31. The memory system of claim 28, wherein the bias circuit charges the gates of the plurality of current replication transistors to an operating bias with no conducting path to a ground when the memory is in low power mode.

32. The memory system of claim 26, wherein the reference current generation and distribution circuit can be selectively adjusted to conduct a current that is a multiple of a current conducted by the reference current generation source.

33. A method of generating and distributing a reference current in a memory device comprising:

generating a reference current;

replicating the reference current in a replication circuit; and maintaining a bias in the replication circuit when in a low power mode.

34. The method of claim 33, wherein the replication circuit comprises:

a replication control circuit to generate a voltage output from the reference current; and a replication transistor to reproduce the reference current where a gate of the replication transistor is coupled to the voltage output.

35. The method of claim 34, wherein the bias is maintained by a bias maintenance circuit coupled to the gate of the replication transistor.

36. The method of claim 35, wherein the bias maintenance circuit comprises:

a PMOS transistor with a source coupled to a power supply, and a gate coupled to a drain;

a NMOS transistor with a drain coupled to the power supply, a source coupled to the voltage output of the replication control circuit, and a gate coupled to the drain of the PMOS transistor.

37. The method of claim 36, wherein the bias maintenance circuit further comprises a first transistor coupled between the voltage output of the replication control circuit and the bias maintenance circuit for isolating the bias maintenance circuit from the voltage output of the replication circuit.

38. The method of claim 36, wherein the bias maintenance circuit further comprises a second transistor coupled between the power supply and the bias maintenance circuit for isolating the bias maintenance circuit from the power supply.

39. The method of claim 35, wherein the bias maintenance circuit charges the gate of the replication transistor to a bias without a conducting path to a ground connection when the memory device is in a low power mode.

40. The method of claim 33, wherein the replication circuit can be selectively adjusted to conduct a current that is a multiple of a current conducted by the reference current.

41. A memory device sense amplifier comprising:

a current reference input to receive a reference current;

a data input to receive a data input current;

a comparator circuit to determine a relative level of the data current with the current reference; and a standby bias circuit to maintain a bias on the comparator circuit when in a standby mode.

42. The memory device sense amplifier of claim 41, wherein the memory device sense amplifier is incorporated in a non-volatile memory.

43. The memory device sense amplifier of claim 41, wherein the reference current is generated by a reference current transistor, a gate of the reference current transistor is coupled to receive a reference current control voltage from a reference current control circuit.

44. The memory device sense amplifier of claim 43, wherein the standby bias circuit is coupled to the gate of the reference current transistor.

45. The memory device sense amplifier of claim 44, wherein the standby bias circuit comprises:

a PMOS transistor with a source coupled to a positive power source, and a gate coupled to a drain; and a NMOS transistor with a drain coupled to the positive power source, a source connected to the gate of the reference current transistor, and a gate coupled to the drain of the PMOS transistor.

46. The memory device sense amplifier of claim 45, wherein the standby bias circuit further comprises a first isolation transistor to isolate the standby bias circuit from the gate of the reference current transistor.

47. The memory device sense amplifier of claim 46, further comprises a second isolation transistor to isolate the standby bias circuit from the positive power supply.

48. The memory device sense amplifier of claim 45, wherein the standby bias circuit charges the gate of the reference transistor to a bias without a conducting path to a ground connection when the memory device sense amplifier is in a low power mode.

49. A method of sensing a current data signal in a memory device comprising:
  receiving a reference current on a reference current input;
  receiving a bit line current on a data input;
  comparing the reference current and the bit line current to determine a relative level; and
  maintaining a bias on the reference current input when in standby mode.

50. A memory device current reference circuit comprising:
  a reference circuit with a flash cell to provide a reference current;
  a reference control circuit to receive the reference current and output a control voltage on a control circuit output;
  a sense circuit coupled to receive the control voltage and replicate the reference current; and
  a bias circuit coupled to the control circuit output to maintain a bias during low power operation.

51. A memory device current reference circuit comprising:
  a reference circuit with a flash cell to provide a reference current;
  a reference control circuit to receive the reference current and output a control voltage on a control circuit output;
  a sense circuit coupled to receive the control voltage and replicate the reference current; and
  a bias circuit coupled to the control circuit output to maintain a bias during low power operation, wherein the bias circuit comprises:
    a PMOS transistor,
      wherein a source is coupled to a positive power supply, and
      a gate is coupled to a drain; and
    a NMOS transistor
      wherein a drain is coupled to the positive power supply,
      a gate is coupled to the drain of the PMOS transistor, and
      a source is coupled to the voltage output.

52. The memory device current reference circuit of claim 51, wherein the bias circuit further comprises a first transistor coupled to isolate the bias circuit from the positive power source and a second transistor coupled to isolate the bias circuit from the control circuit output.

53. A memory device current reference circuit comprising:
  a reference circuit with a flash cell to provide a reference current;
  a reference control circuit to receive the reference current and output a control voltage on a control circuit output;
  a sense circuit coupled to receive the control voltage and replicate the reference current; and
  a bias circuit coupled to the control circuit output to maintain a bias during low power operation, wherein the bias circuit charges the control circuit output to a bias without a conducting path to a ground connection when the memory device sense amplifier is in a low power mode.

54. A memory device current reference circuit comprising:
  a reference circuit with a flash cell to provide a reference current;
  a reference control circuit to receive the reference current and output a control voltage on a control circuit output;
  a sense circuit coupled to receive the control voltage and replicate the reference current; and
  a bias circuit coupled to the control circuit output to maintain a bias during low power operation, wherein the reference control circuit can be selectively adjusted such that the sense circuit replicates a multiple of the reference current.

55. A non-volatile memory device comprising:
  a current sense amplifier to compare a bit line current with a reference current, where the current sense amplifier generates the reference current in response to a voltage provided on a voltage connection; and
  a bias circuit coupled to the voltage connection to provide a bias voltage when the non-volatile memory is in a low power mode.

56. A non-volatile flash memory comprising:
  an array of non-volatile memory cells;
  a sense amplifier coupled to compare a bit line current with a reference current conducted through a reference transistor;
  a reference circuit coupled to a gate of the reference transistor to provide a reference voltage; and
  a bias circuit coupled to the gate of the reference transistor to provide a bias voltage.

57. The non-volatile flash memory of claim 56, wherein the reference circuit comprises a flash memory cell programmed to conduct the reference current.

58. A non-volatile flash memory device comprising:
  a flash memory cell programmed to conduct a reference current;
  a current mirror control NMOS transistor where a gate is coupled to a source, a drain is coupled to a positive power source, and the source is coupled to the flash memory cell;
  a current replication transistor where a gate is coupled to the source of the current mirror control NMOS transistor to replicate the reference current;
  a sense amplifier coupled to a bit line and coupled to the current replication transistor; and
  a bias circuit coupled to the gate of the current replication transistor to provide a bias voltage.

59. A non-volatile flash memory device comprising:
  a flash memory cell programmed to conduct a reference current;
  a current mirror control transistor coupled to the flash memory cell to sense the reference current and produce a current mirror control output;
  a current replication transistor where a gate is coupled to receive the current mirror control output and replicate the reference current;
  a sense amplifier coupled to receive a bit line current and the reference current from the current replication transistor; and
  a bias circuit coupled to the gate of the current replication transistor to provide a bias voltage.

* * * * *